US012686916B2

(12) United States Patent
Romero et al.

(10) Patent No.: US 12,686,916 B2
(45) Date of Patent: Jul. 21, 2026

(54) METHOD, SYSTEM AND APPARATUS FOR FORMING A METAL SULFIDE LAYER

(71) Applicant: ASM IP Holding B.V., Almere (NL)

(72) Inventors: Patricio Eduardo Romero, Wilsele (BE); Charles Dezelah, Helsinki (FI); Michael Eugene Givens, Oud-Heverlee (BE); Giuseppe Alessio Verni, Vantaa (FI)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/900,427

(22) Filed: Sep. 27, 2024

(65) Prior Publication Data

US 2025/0109492 A1 Apr. 3, 2025

Related U.S. Application Data

(60) Provisional application No. 63/586,909, filed on Sep. 29, 2023.

(51) Int. Cl.

*C23C 16/30* (2006.01)
*C23C 16/44* (2006.01)

(52) U.S. Cl.

CPC ........ *C23C 16/305* (2013.01); *C23C 16/4408* (2013.01)

(58) Field of Classification Search

None

See application file for complete search history.

(56) References Cited

U.S. PATENT DOCUMENTS 11,289,579 B2 3/2022 Lin
2020/0373404 A1 11/2020 Lin
2022/0165575 A1* 5/2022 Xie .................. H01L 21/02192

* cited by examiner

*Primary Examiner* — Michael G Miller

(74) *Attorney, Agent, or Firm* — Banner & Witcoff, Ltd.

(57) ABSTRACT

A method, system and apparatus are disclosed for depositing a threshold voltage shifting layer comprising an oxygen-free metal sulfide on a substrate, wherein the depositing further comprises, providing a substrate having a surface within a reaction chamber, a) providing an oxygen-free precursor comprising a metal to the reaction chamber to contact the surface, b) providing an oxygen-free, sulfur-containing reactant to the reaction chamber to contact the surface, c) purging the reaction chamber and repeating operations a), b) or c) or any combination thereof until the threshold voltage shifting layer of a predetermined thickness is deposited on the surface.

13 Claims, 4 Drawing Sheets

METHOD, SYSTEM AND APPARATUS FOR FORMING A METAL SULFIDE LAYER

CROSS-REFERENCE TO RELATED APPLICATION(S)

This application claims the benefit of U.S. Provisional Application 63/586,909 filed on Sep. 29, 2023, the entire contents of which are incorporated herein by reference.

FIELD OF THE DISCLOSURE

The present disclosure generally relates to the field of semiconductor processing methods and systems, and to the field of electronic devices, and in particular, methods and systems suitable for forming layers comprising a metal sulfide.

BACKGROUND OF THE DISCLOSURE

The scaling of semiconductor devices, such as, complementary metal-oxide-semiconductor (CMOS) devices, has led to significant improvements in speed and density of integrated circuits. However, conventional device scaling techniques face significant challenges for future technology nodes.

For example, one challenge has been finding a suitable conducting material for use as a gate electrode, and particularly threshold voltage shift materials, in aggressively scaled CMOS devices. Therefore, improved materials for gate electrodes are desired. In particular, such materials can include threshold voltage shifting layers, and can be used for threshold voltage tuning.

SUMMARY OF THE DISCLOSURE

This summary is provided to introduce a selection of concepts in a simplified form. These concepts are described in further detail in the detailed description of example embodiments of the disclosure below. This summary is not intended to necessarily identify key features or essential features of the claimed subject matter, nor is it intended to be used to limit the scope of the claimed subject matter.

In one aspect, a method includes depositing a threshold voltage shifting layer including a metal sulfide on a substrate, wherein the depositing further includes a) providing a substrate having a surface within a reaction chamber, b) providing an oxygen-free metal precursor to the reaction chamber to contact the surface, c) providing an oxygen-free, sulfur-containing reactant to the reaction chamber to contact the surface, d) purging the reaction chamber, and repeating operations b), c) or d) or any combination thereof until the threshold voltage shifting layer of a predetermined thickness is deposited on the surface.

In certain examples, the method may also include where the surface includes an interlayer material and the threshold voltage shifting layer is deposited in a dipole first pattern directly onto the interlayer material surface.

In some examples, the method may also include where the surface includes a high-k material and the threshold voltage shifting layer is deposited in a dipole last pattern directly onto the high-k material surface.

In various examples, the method may also include where the metal includes titanium (Ti), zirconium (Zr), hafnium (Hf), tantalum (Ta), aluminum (Al), scandium (Sc), lutetium (Lu), yttrium (Y), magnesium (Mg), lanthanum (La), or strontium (Sr), or a combination thereof.

In certain examples, the method may also include where the oxygen-free precursor is a metal cyclopentadienyl compound, and the metal includes scandium (Sc), lutetium (Lu), yttrium (Y), magnesium (Mg), lanthanum (La), or strontium (Sr).

In some examples, the method may also include where the oxygen-free precursor is a metal alkylamido compound, and the metal includes titanium (Ti), zirconium (Zr), hafnium (Hf), tantalum (Ta), or aluminum (Al).

In various examples, the method may also include where the oxygen-free precursor is a metal amidinate compound, and the metal includes scandium (Sc), lutetium (Lu), yttrium (Y), magnesium (Mg), lanthanum (La), or strontium (Sr).

In certain examples, the method may also include where the sulfur-containing reactant includes H2S.

In certain embodiments, the method may also include where the sulfur-containing reactant compound formula is HS(CRR')xSH, where R and R' are independently selected from the group consisting of hydrogen (H), methyl (Me), ethyl (Et), n-propyl (nPr), and x is an integer from 1 to 12.

In various embodiments, the method may also include where the sulfur-containing reactant compound formula is S(SiRR'R")2, where R, R' and R" are independently selected from the group consisting of H, Me, Et, nPr, isopropyl (iPr), tert-butyl (tBu), normal butyl (nBu), sec-butyl (sec-Bu), and iso-butyl (iso-Bu).

In certain examples, the method may also include where the sulfur-containing reactant compound formula is S2RR', where R and R' are independently selected from the group consisting of Me, Et, nPr, iPr, tBu, nBu, sec-Bu, and iso-Bu.

In various embodiments, the method may also include where the sulfur-containing reactant compound formula is RSH, where R is a straight-chain or branched alkyl group containing from 1 to 10 carbon atoms.

In particular examples, the method may also include where the sulfur-containing reactant includes only sulfur atoms.

In some examples, the method may also include where the sulfur-containing reactant includes sulfur and a halogen.

In certain examples, the method may also include where the metal amidinate compound is of the formula (Formula 1):

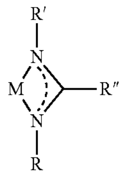

where M is a metal, R and R' are independently any branched alkyl, unbranched alkyl, cyclic alkyl, or acyclic alkyl, or a combination thereof, containing from 1-10 carbon atoms, and R" is hydrogen, dimethylamino, diethylamino, ethylmethylamino or an alkyl containing 1-6 carbon atoms, where R and R' are independently selected from the group consisting of isopropyl, tert-butyl, sec-butyl, and tert-pentyl, and where R" is hydrogen or methyl.

In certain examples, the method may also include where the sulfur-containing reactant is HS(CH2)2SH or HS(CH)3SH.

In various examples, the method may also include where the sulfur-containing reactant is S(SiMe3)2 or S (SiEt3)2.

In particular examples, the method may also include where the sulfur-containing reactant is S2Me2, S2Et2 or S2(tBu)2.

For the purpose of summarizing the disclosure and the advantages achieved over the prior art, certain objects and advantages of the disclosure have been described herein above. Of course, it should be understood that not necessarily all such objects or advantages can be achieved in accordance with any particular embodiment or example of the disclosure. Thus, for example, those skilled in the art will recognize that the examples disclosed herein can be carried out in a manner that achieves or optimizes one advantage or group of advantages as taught or suggested herein without necessarily achieving other objects or advantages as can be taught or suggested herein. All of these examples are intended to be within the scope of the disclosure. These and other embodiments will become readily apparent to those skilled in the art from the following detailed description of certain examples having reference to the attached figures, the disclosure not being limited to any particular example(s) discussed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
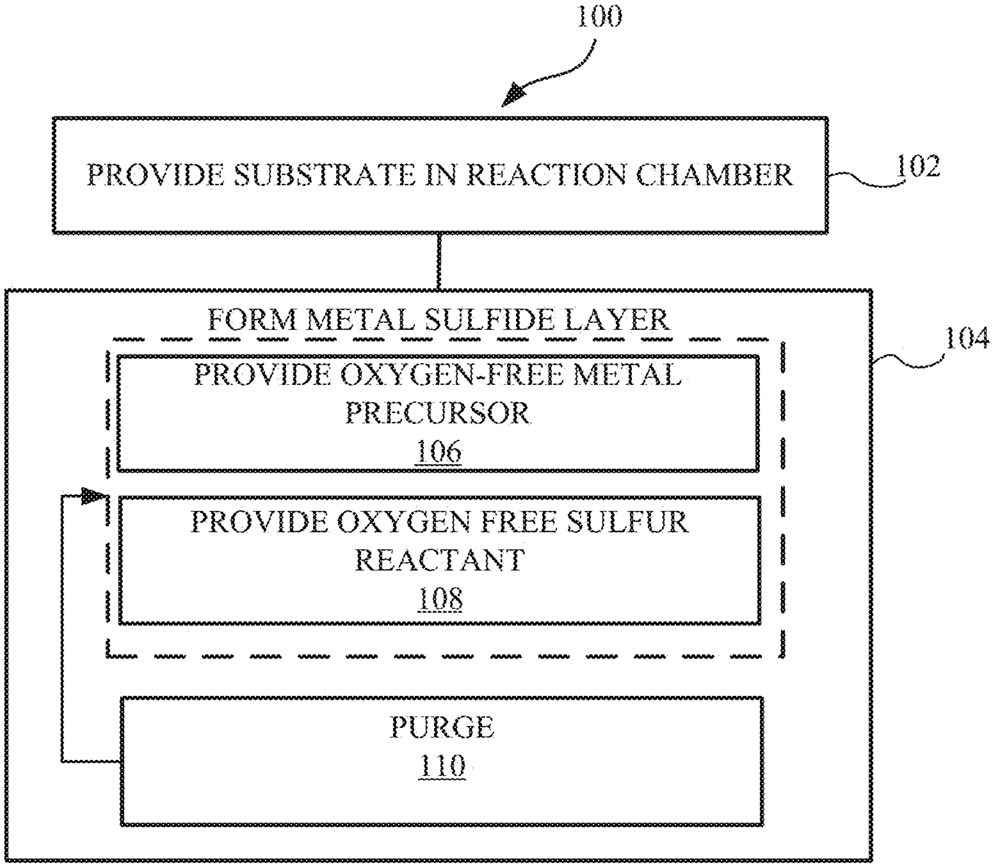
FIG. 1 illustrates a method in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION

The detailed description of various examples herein makes reference to the accompanying drawings, which show the exemplary examples by way of illustration. While these exemplary examples are described in sufficient detail to enable those skilled in the art to practice the disclosure, it should be understood that other examples may be realized and that logical, chemical, and/or mechanical changes may be made without departing from the spirit and scope of the disclosure. Thus, the detailed description herein is presented for purposes of illustration only and not of limitation. For example, the steps recited in any of the method or process descriptions can be executed in any combination and/or order and are not limited to the combination and/or order presented. Further, one or more steps from one of the disclosed methods or processes can be combined with one or more steps from another of the disclosed methods or processes in any suitable combination and/or order. Moreover, any of the functions or steps can be outsourced to or performed by one or more third parties. Furthermore, any reference to singular includes plural examples, and any reference to more than one component can include a singular example.

Although certain embodiments and examples are disclosed below, it will be understood by those in the art that the disclosure extends beyond the specifically disclosed examples and/or uses of the disclosure and obvious modifications and equivalents thereof. Thus, it is intended that the scope of the disclosure should not be limited by the particular examples described herein.

The illustrations presented herein are not meant to be actual views of any particular material, apparatus, structure, or device, but are merely representations that are used to describe examples of the disclosure.

As used herein, the term "atomic layer deposition" (ALD) can refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) can subsequently be introduced into the process chamber for use in converting the chemisorbed precursor to the desired material on the deposition surface. Typically, this reactant is capable of further reaction with the precursor. Further, purging steps can also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "chemical vapor deposition" (CVD) can refer to any process wherein a substrate is exposed to one or more volatile precursors, which react and/or decompose on a substrate surface to produce a desired deposition.

Further, in this disclosure, any two numbers of a variable can constitute a workable range of the variable, and any ranges indicated can include or exclude the endpoints. Additionally, any values of variables indicated (regardless of whether they are indicated with "about" or not) can refer to precise values or approximate values and include equivalents, and can refer to average, median, representative, majority, or the like. Further, in this disclosure, the terms "including," "constituted by" and "having" can refer independently to "typically or broadly comprising," "comprising," "consisting essentially of," or "consisting of" in some examples. In this disclosure, any defined meanings do not necessarily exclude ordinary and customary meanings in some examples.

The present disclosure may include methods, systems and devices for forming a semiconductor structure including a threshold voltage shifting layer. Threshold voltage shifting layers can enhance semiconductor device performance by modulating the effective work function (EWF) of a metal-oxide-semiconductor (MOS) device.

In some embodiments, a threshold voltage shifting layer can be formed, e.g., by a deposition process, over, or directly over the gate dielectric of a metal-oxide-semiconductor (MOS) device, and the properties of the threshold voltage shifting layer (including, but not limited to, material composition, thickness, and deposition method) can alter the band alignment in the MOS device to a provide a device with a preferred operating performance. Conventional threshold shifting layers comprise oxygen and may generate SiOx at the interface, which can increase the equivalent oxide thickness (EOT) of the device. Therefore, in some embodiments, a threshold voltage shifting layer which is fabricated with oxygen-free materials and is substantially free of oxygen, or has a reduced oxygen composition as a way to control the effective oxide thickness to improve the electrical performance of the end device may be desirable.

As set forth in more detail below, various embodiments of the disclosure provide methods for forming structures and/or devices suitable for a variety of applications. Exemplary methods can be used to, for example, form gate electrodes, and/or form metal sulfide layers suitable for metal oxides semiconductor (MOS) applications (e.g., as a work function layer and/or threshold voltage shifting layer, dipole or flatband shifter), such as in the formation of complimentary MOS (CMOS) devices, for use as etch stop layers, and/or for use as barrier or liner layers (e.g., in FEOL, MEOL and BEOL processing). For example, the metal sulfide layers can be used in the formation of logic devices, dynamic random-access memory (DRAM), three-dimensional NAND devices, as a p-metal layer gate of a logic device, as a p-dipole layer for logic devices, and the like. However, unless noted otherwise, the invention is not necessarily limited to such examples.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor. The term "inert gas" can refer to a gas that does not take part in a chemical reaction and/or does not become a part of a film matrix to an appreciable extent. Exemplary inert gases include helium, argon, and any combination thereof. In some cases, an inert gas can include nitrogen and/or hydrogen.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of examples, a substrate can include bulk semiconductor material and an insulating or dielectric material layer overlying at least a portion of the bulk semiconductor material.

As used herein, the term "film" and/or "layer" can refer to any continuous or non-continuous structure and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

As used herein, a "structure" can be or include a substrate as described herein. Structures can include one or more layers overlying the substrate, such as one or more layers formed according to a method as described herein. Device portions can be or include structures.

The term "cyclic deposition process" or "cyclical deposition process" can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

As used herein, a "metal sulfide layer" or "a layer including metal sulfide" can be a material layer that can be represented by a chemical formula that includes a metal and sulfur.

As used herein "oxygen-free metal sulfide" or "oxygen-free metal sulfide layer" can be metal sulfide layer that is oxygen-free or substantially oxygen-free comprising less than about 7% oxygen, or less than about 5% oxygen, or less than about 4% oxygen, or less than about 3% oxygen, or less than about 2% oxygen, or less than about 1% oxygen, or less than about .1% oxygen, ("about" in this context means plus or minus .5%).

In certain examples, a metal component of the metal sulfide layer may comprise, titanium (Ti), zirconium (Zr), hafnium (Hf), tantalum (Ta), aluminum (Al), scandium (Sc), lutetium (Lu), yttrium (Y), magnesium (Mg), lanthanum (La), or strontium (Sr), or a combination thereof.

As used herein, an "oxygen-free metal precursor" includes a gas or a material that can become gaseous and that can be represented by a chemical formula that does not include oxygen.

As used herein, an "oxygen-free, sulfur-containing reactant" includes a gas or a material that can become gaseous and that can be represented by a chemical formula that includes sulfur(S) and that does not include oxygen.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

Turning now to the figures, FIG. 1 illustrates a method 100 in accordance with exemplary embodiments of the disclosure. Method 100 can be used to, for example, form a structure including a metal sulfide layer (e.g., metal sulfide layer 208) which may be oxygen-free or substantially oxygen-free. The metal sulfide layer can be used during a formation of a device, such as a device noted herein. However, unless otherwise noted, methods are not limited to such applications.

Method 100 includes the steps of providing a substrate within a reaction chamber of a reactor (step 102) and using a cyclical deposition process, depositing a layer comprising a metal sulfide layer onto a surface of the substrate (step 104).

During step 102, a substrate is provided within a reaction chamber. The reaction chamber used during step 102 can be or include a reaction chamber of a chemical vapor deposition reactor system configured to perform a cyclical deposition process. The reaction chamber can be a standalone reaction chamber or part of a cluster tool.

Step 102 can include heating the substrate to a desired deposition temperature within the reaction chamber. In some embodiments of the disclosure, step 102 includes heating the substrate to a temperature of less than 800° C. For example, in some embodiments of the disclosure, heating the substrate to a deposition temperature may comprise heating the substrate to a temperature between approximately 20° C. and approximately 800° C., about 100° C. and about 400° C., about 20° C. and about 300° C., or about 20° C. and about 200° C.

In addition to controlling the temperature of the substrate, a pressure within the reaction chamber may also be regulated. For example, in some embodiments of the disclosure, the pressure within the reaction chamber during step 102 may be less than 760 Torr or between 0.2 Torr and 760 Torr, about 1 Torr and 100 Torr, or about 1 Torr and 10 Torr.

During step 104, a metal sulfide layer is deposited onto a surface of the substrate using a cyclical deposition process. As noted above, the cyclical deposition process can include cyclical CVD, ALD, or a hybrid cyclical CVD/ALD process. For example, in some embodiments, the growth rate of a particular ALD process may be low compared with a CVD process. One approach to increase the growth rate may be that of operating at a higher deposition temperature than that typically employed in an ALD process, resulting in some portion of a chemical vapor deposition process, but still taking advantage of the sequential introduction of reactants. Such a process may be referred to as cyclical CVD. In some embodiments, a cyclical CVD process may comprise the introduction of two or more reactants into the reaction chamber, wherein there may be a time period of overlap between the two or more reactants in the reaction chamber resulting in both an ALD component of the deposition and a CVD component of the deposition. This is referred to as a hybrid process.

In accordance with further examples, a cyclical deposition process may comprise pulsing and/or flowing of a metal precursor (step 106) and/or pulsing and/or flowing of a sulfur-containing reactant (step 108) into the reaction chamber. Such pulsing and/or flowing of the metal precursor (step 106) and/or sulfur-containing reactant (step 108) may be sequential, concurrent, cyclic, and/or repeating, and claimed subject matter is not limited in this regard. In certain examples, the metal precursor may be an oxygen-free metal precursor. Likewise, the sulfur-containing reactant may be an oxygen-free sulfur-containing reactant.

By way of particular examples, the metal in the metal precursor may comprise titanium (Ti), zirconium (Zr), hafnium (Hf), tantalum (Ta), aluminum (Al), scandium (Sc), lutetium (Lu), yttrium (Y), magnesium (Mg), lanthanum (La), or strontium (Sr), or a combination thereof.

In certain examples, an oxygen-free metal precursor may comprise a metal cyclopentadienyl compound. In some examples, a metal of such a metal cyclopentadienyl compound may comprise scandium (Sc), lutetium (Lu), yttrium (Y), magnesium (Mg), lanthanum (La), or strontium (Sr), or a combination thereof.

In other particular examples, an oxygen-free metal precursor may comprise a metal alkylamido compound. In some examples, a metal of such a metal alkylamido compound may comprise titanium (Ti), zirconium (Zr), hafnium (Hf), tantalum (Ta), or aluminum (Al), or a combination thereof.

In other examples, an oxygen-free precursor is a metal amidinate compound. In some examples, a metal of such a metal amidinate compound may comprise scandium (Sc), lutetium (Lu), yttrium (Y), magnesium (Mg), lanthanum (La), or strontium (Sr), or a combination thereof.

In certain examples, the metal amidinate compound is of the formula (Formula 1):

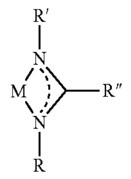

wherein: M is a metal; R and R' are independently any branched alkyl, unbranched alkyl, cyclic alkyl, or acyclic alkyl, or a combination thereof, containing from 1-10 carbon atoms; and R" is hydrogen, dimethylamino, diethylamino, ethylmethylamino or an alkyl containing 1-6 carbon atoms.

Referring still to the metal amidinate compound of Formula 1, in an example, R and R' may be independently selected from the group consisting of isopropyl, tert-butyl, sec-butyl, and tert-pentyl.

Referring still to the metal amidinate compound of Formula 1, in an example, R" may be hydrogen or methyl.

In certain examples, a sulfur-containing reactant may be oxygen free and may comprise a compound having the formula HS(CRR') xSH, wherein R and R' are independently selected from the group consisting of hydrogen (H), methyl (Me), ethyl (Et), n-propyl (nPr), and wherein x is an integer from 1 to 12.

An exemplary sulfur-containing reactant of this type may be HS(CH2)2SH or HS(CH)3SH.

In certain examples, a sulfur-containing reactant may be oxygen free and may comprise a compound having the formula S (SiRR'R")2, wherein R, R' and R" are independently selected from the group consisting of H, Me, Et, nPr, isopropyl (iPr), tert-butyl (tBu), normal butyl (nBu), sec-butyl (sec-Bu), and iso-butyl (iso-Bu).

An exemplary sulfur-containing reactant of this type may be S(SiMe3)2 or S(SiEt3)2.

In certain examples, a sulfur-containing reactant may be oxygen free and may comprise a compound having the formula S2RR', wherein R and R' are independently selected from the group consisting of Me, Et, nPr, iPr, tBu, nBu, sec-Bu, and iso-Bu.

An exemplary sulfur-containing reactant of this type may be S2Me2, S2Et2 or S2(tBu)2.

In certain examples, a sulfur-containing reactant may be oxygen free and may comprise a compound having the formula RSH, wherein R is a straight-chain or branched alkyl group containing from 1 to 10 carbon atoms.

An exemplary sulfur-containing reactant of this type may be tBuSH or iPrSH.

In certain examples, a sulfur-containing reactant may be oxygen free and may comprise a compound having only sulfur atoms.

An exemplary sulfur-containing reactant of this type may be S4 or S8.

In certain examples, a sulfur-containing reactant may be oxygen free and may comprise a compound having sulfur and a halogen. In certain examples, the halogen may be chlorine. In some examples, such a sulfur-containing reactant may be SCl2 or S2Cl2.

An exemplary sulfur-containing reactant comprising a compound having sulfur and a halogen, may comprise an S—S bond.

In an example, hydrogen sulfide (H2S) may be an oxygen-free sulfur-containing reactant.

The cyclical deposition process can include (e.g., separately and/or sequentially) providing an oxygen-free precursor comprising a metal precursor (step 106) to the reaction chamber and providing an oxygen-free, sulfur-containing reactant to the reaction chamber (step 108). A purge may be carried out at any point during the cyclical process, for example, to remove byproducts (step 110). Purge step 110 may be executed before or after providing one or more precursors and/or reactants to the chamber.

In some cases, two or more precursors and/or two or more reactants can be flowed to the reaction chamber, such that the two or more precursors and/or two or more reactants overlap within the reaction chamber. For example, one or more oxygen-free metal precursors and/or one or more sulfur-containing reactants can be co-flowed to the reaction chamber.

In the case of thermal cyclical deposition processes, a duration of the step of providing reactant to the reaction chamber can be relatively long to allow the reactant to react with the precursor or a derivative thereof. For example, the duration can be greater than or equal to .1 seconds or greater than or equal to 60 seconds or between about .1 and 60 seconds.

As part of step 104, the reaction chamber can be purged (step 110) using a vacuum and/or an inert gas to, for example, mitigate gas phase reactions between reactants and enable self-saturating surface reactions—e.g., in the case of ALD. Additionally or alternatively, the substrate may be moved to separately contact a first vapor phase reactant and a second vapor phase reactant. Surplus chemicals and reaction byproducts, if any, can be removed from the substrate surface or reaction chamber, such as by purging the reaction space or by moving the substrate, before the substrate is contacted with the next reactive chemical. The reaction chamber can be purged after the step of providing a precursor to the reaction chamber and/or after the step of providing a reactant to the reaction chamber.

In some embodiments of the disclosure, method 100 includes repeating a unit deposition cycle that includes (1) providing one or more of an oxygen-free metal precursor to the reaction chamber and (2) providing an oxygen-free, sulfur-containing reactant to the reaction chamber, with optional purge or move steps after step (1) and/or step (2). The deposition cycle can be repeated one or more times, based on, for example, desired thickness of the metal sulfide layer. For example, if the thickness of the metal sulfide layer is less than desired for a particular application, then the step of providing a precursor to the reaction chamber and providing a reactant to the reaction chamber can be repeated one or more times. Once the metal sulfide layer has been deposited to a desired thickness, the substrate can be subjected to additional processes to form a device structure and/or device.

In some embodiments, a step coverage of the metal sulfide layer is equal to or greater than about 50%, or greater than about 80%, or greater than about 90%, or about 95%, or about 98%, or about 99% or greater, in/on structures having aspect ratios (height/width) of more than about 2, more than about 5, more than about 10, more than about 25, more than about 50, more than about 100, or between about 10 and 100 or about 5 and about 25.

A growth rate of the metal sulfide layer can be relatively low—e.g., less than 3 angstroms/cycle, between about 0.2 and 3 angstroms/cycle, or about 0.1 to about 1 angstrom/cycle. The relatively low growth rate can facilitate desired accuracy of film thickness and/or film thickness uniformity. Wherein the metal sulfide layer is in a threshold voltage shifting layer, such a layer may be operational even if not fully closed as their total thickness may be less than one angstrom. Thus, a low growth rate and high accuracy may be advantageous in the case of such a thin layer.

Figure 2A:
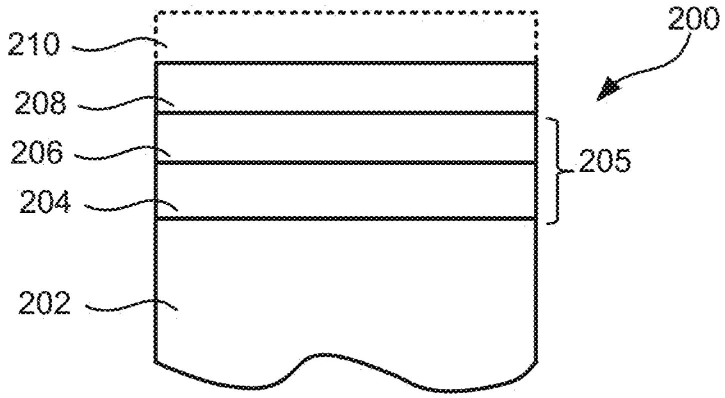
FIGS. 2A-2C illustrate exemplary structures in accordance with embodiments of the disclosure.

FIG. 2A illustrates a structure/a portion of a device 200 in accordance with additional examples of the disclosure. Device or structure 200 includes a substrate 202, dielectric or insulating material 205, and a metal sulfide layer 208. In an example the metal sulfide layer 208 is a threshold voltage shifting layer. In the illustrated example, structure 200 also includes an additional conducting layer 210.

Substrate 202 can be or include any of the substrate materials described herein.

Dielectric or insulating material 205 can include one or more dielectric or insulating material layers. By way of example, dielectric or insulating material 205 can include an interface layer 204 and a high-k material 206 deposited overlying interface layer 204. Metal sulfide layer 208 is deposited in a dipole last pattern directly onto the high-k material 206 surface.

In some cases, interface layer 204 may not exist or may not exist to an appreciable extent. Interface layer 204 can include an oxide, such as a silicon oxide, which can be formed on a surface of the substrate 202 using, for example, a chemical oxidation process or an oxide deposition process. High-k material 206 can be or include, for example, a metallic oxide having a dielectric constant greater than about 7. In some embodiments, the high-k material has a dielectric constant higher than the dielectric constant of silicon oxide. Exemplary high-k materials include one or more of hafnium oxide (HfO2), tantalum oxide (Ta2O5), zirconium oxide (ZrO2), titanium oxide (TiO2), hafnium silicate (HfSiOx), aluminum oxide (Al2O3), lanthanum oxide (La2O3), and mixtures/laminates comprising one or more such layers.

In an example, metal sulfide layer 208 can be formed according to a method described herein. Because metal sulfide layer 208 is formed using a cyclical deposition process, a concentration of sulfur and/or metal and/or other constituents in metal sulfide layer 208 can vary from a bottom of metal sulfide layer 208 to a top of metal sulfide layer 208 by, for example, controlling an amount of oxygen-free metal precursor and/or oxygen-free sulfur-containing reactant(s) and/or respective pulse times during one or more deposition cycles. In some cases, metal sulfide layer 208 can have a stochiometric composition. A work function and other properties of metal sulfide layer 208 can be altered by altering an amount of sulfur and/or metal and/or other compounds in the layer or in a deposition cycle.

In an example, metal sulfide layer 208 can include impurities, such as halides, hydrogen, and/or oxygen or the like in an amount of less than ten atomic percent, five atomic percent, less than one atomic percent, less than 0.2 atomic percent, less than 0.1 atomic percent, or less than 0.05 atomic percent, alone or combined.

A thickness of metal sulfide layer 208 can vary according to application. By way of examples, a desired or predetermined thickness of metal sulfide layer 208 can be less than 10 nm or about 0.05 nm to about 10 nm, or about 0.06 nm to about 5 nm, or about 0.07 nm to about 5 nm, or about 0.08 nm to about 4 nm, or about 0.09 nm to about 3 nm, or about 0.1 nm to about 2 nm. In an example, metal sulfide layer 208 may be relatively thin, which may be desirable for many applications, including work function and/or threshold voltage shifting layers. In an example, metal sulfide layer 208 may form a non-continuous functional layer operable to perform voltage threshold adjustment. In some cases, a thickness of metal sulfide layer 208 can be greater than 2 nm—e.g., when metal sulfide layer 208 is used as a barrier layer or liner.

A thickness and/or composition of metal sulfide layer 208 can be manipulated to obtain a desired shift in work function and/or threshold voltage. In an example, a work function of a shifted metal sulfide layer 208 may be >4.6 eV, >4.7 eV, >4.8 eV, >4.9 eV, >4.95 eV, or >5.0 eV. A work function value of a device can be shifted by about 30 meV to about 400 me V, or about 30 meV to about 200 meV, or about 50 meV to about 100 meV using an metal sulfide layer 208 as described herein.

Additionally or alternatively, metal sulfide layer 208 can form a continuous film—e.g., using method 100—at a thickness of <5 nm, <4 nm, <3 nm, <2 nm, <1.5 nm, <1.2 nm, <1.0 nm, or <0.9 nm. metal sulfide layer 208 can be relatively smooth, with relatively low grain boundary formation.

Figure 2B:
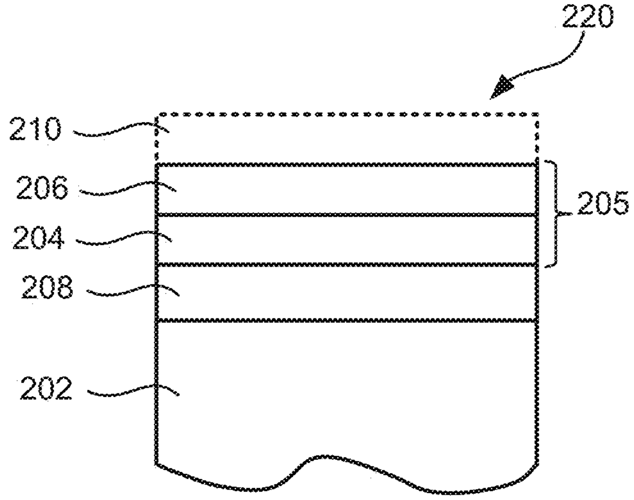

In some cases, metal sulfide layer 208 can additionally or alternatively be formed directly over substrate 202 underlying dielectric or insulating material 205 (which can include various layers and/or topologies) as illustrated in FIG. 2B in accordance with additional examples of the disclosure. Device or structure 220 includes a substrate 202, dielectric or insulating material 205 including interface layer 204 and a high-k material 206 deposited overlying interface layer 204. Structure 220 also includes an additional conducting layer 210. Interface layer 204 is deposited overlying metal sulfide layer 208.

Figure 2C:
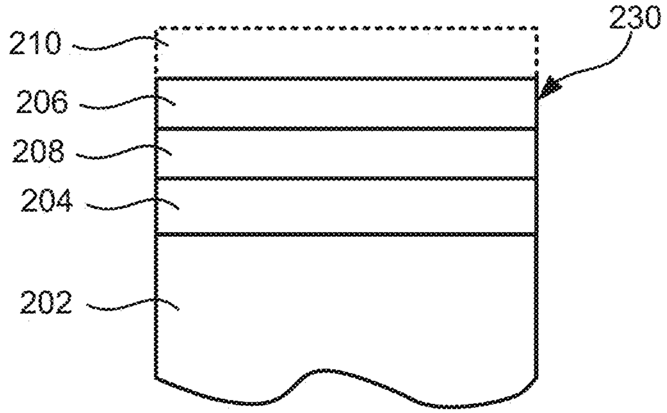

In some cases, metal sulfide layer 208 can additionally or alternatively be formed, between interface layer 204 and high-k material 206, and/or between layers of high-k material 206 as illustrated in FIG. 2C in accordance with additional examples of the disclosure. FIG. 2C is similar to the structure shown in FIGS. 2A and 2B except that the threshold metal sulfide layer 208 is situated between the interface layer 204 and the high-k material 206. Metal sulfide layer 208 is deposited in a dipole first pattern directly onto the interface layer 204 surface.

Device or structure 230 includes a substrate 202, metal sulfide layer 208 is deposited directly on interface layer 204 and a high-k material 206 is deposited overlying metal sulfide layer 208. Structure 230 also includes an additional conducting layer 210. Further, metal sulfide layer 208 may be deposited and at least partially removed, such that resultant structures may no longer include metal sulfide layer 208 or include a lesser number of metal sulfide layers than were initially formed on the structure.

Figure 3:
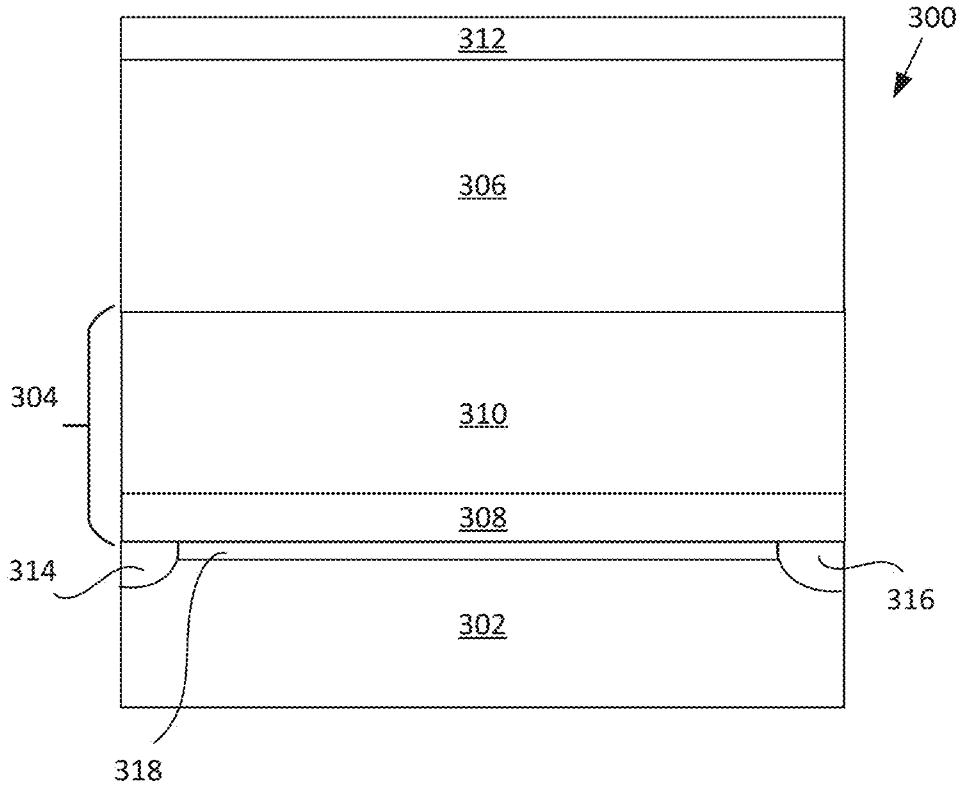
FIG. 3 illustrates an exemplary structure in accordance with embodiments of the disclosure.

FIG. 3 illustrates another exemplary structure 300 in accordance with examples of the disclosure. Device or structure 300 includes a substrate 302, dielectric or insulating material 304, and metal sulfide layer 306. In an example, metal sulfide layer 306 comprises a threshold voltage shifting layer. In the illustrated example, structure 300 also includes an additional conducting layer 312. Substrate 302, dielectric or insulating material 304, metal sulfide layer 306, and an additional conducting layer 312 can be the same or similar to substrate 202, dielectric or insulating material 205, metal sulfide layer 208 and conducting layer 210. Similar to above, metal sulfide layer 306 can additionally or alternatively be formed overlying substrate 302 (which can include various layers and/or topologies) and/or underlying insulating material 304, between interface layer 308 and high-k material 310, and/or between layers of high-k material 310. Further, metal sulfide layer 306 may be deposited and at least partially removed, such that resultant structures may no longer include metal sulfide layer 306 or include a lesser number of metal sulfide layer than were initially formed on the structure.

In the illustrated example, substrate 302 includes a source region 314, a drain region 316, and a channel region 318. Although illustrated as a horizontal structure, structures and devices in accordance with examples of the disclosure can include vertical and/or three-dimensional structures and devices, such as FinFET devices.

Figure 4:
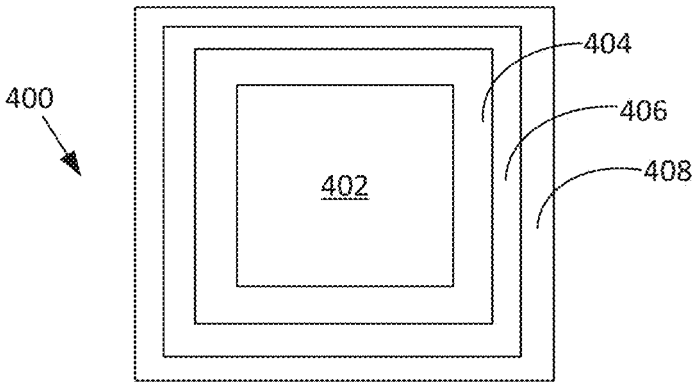
FIG. 4 illustrates an exemplary structure in accordance with embodiments of the disclosure.

FIG. 4 illustrates another structure 400 in accordance with examples of the disclosure. Structure 400 is suitable for gate all around field effect transistors (GAA FET) (also referred to as lateral nanowire FET) devices and the like.

In the illustrated example, structure 400 includes semiconductor material 402, dielectric material 404, a metal sulfide layer 406, and a conducting layer 408. Structure 400 can be formed overlying a substrate, including any substrate materials described herein. In an example, metal sulfide layer 406 is a threshold voltage shifting layer.

Semiconductor material 402 can include any suitable semiconducting material. For example, semiconductor material 402 can include Group IV, Group III-V, or Group II-VI semiconductor material. By way of example, semiconductor material 402 includes silicon.

Dielectric material 404, metal sulfide layer 406, and conducting layer 408 can be the same or similar to dielectric or insulating material 205, metal sulfide layer 208 and conducting layer 210, described above. Metal sulfide layer 406 can be formed overlying semiconductor material 402 and/or underlying dielectric material 404 in accordance with further examples of the disclosure.

Figure 5:
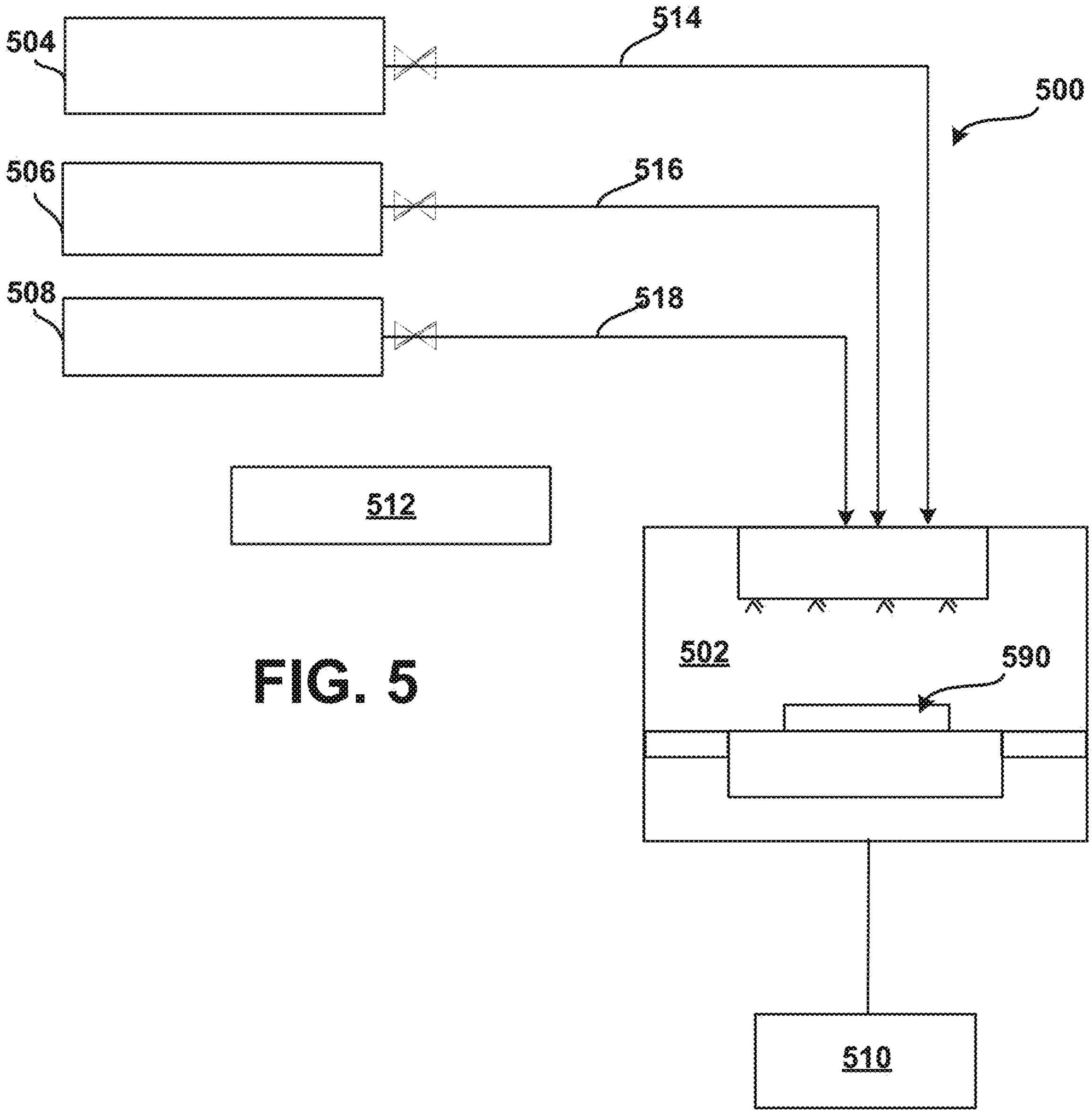
FIG. 5 illustrates a reactor system in accordance with additional exemplary embodiments of the disclosure.

FIG. 5 illustrates a system 500 in accordance with yet additional exemplary embodiments of the disclosure. System 500 can be used to perform a method as described herein and/or form a structure or device portion as described herein.

In the illustrated example, system 500 includes one or more reaction chambers 502, a precursor gas source 504, a reactant gas source 506, a purge gas source 508, an exhaust source 510, and a controller 512.

Reaction chamber 502 can include any suitable reaction chamber, such as an ALD or CVD reaction chamber.

Precursor gas source 504 can include a vessel and one or more oxygen-free metal precursors as described herein—alone or mixed with one or more carrier (e.g., inert) gases. Reactant gas source 506 can include a vessel and one or more oxygen-free sulfur-containing reactants as described herein—alone or mixed with one or more carrier gases. Purge gas source 508 can include one or more inert gases as described herein. Although illustrated with three gas sources 504-508, system 500 can include any suitable number of gas sources. Gas sources 504-508 can be coupled to reaction chamber 502 via lines 514-518, which can each include flow controllers, valves, heaters, and the like.

Exhaust source 510 can include one or more vacuum pumps.

Controller 512 includes electronic circuitry and software to selectively operate valves, manifolds, heaters, pumps and other components included in system 500. Such circuitry and components operate to introduce precursors, reactants, and purge gases from the respective sources 504-508. Controller 512 can control timing of gas pulse sequences, temperature of the substrate and/or reaction chamber, pressure within the reaction chamber, and various other operations to provide proper operation of system 500. Controller 512 can include control software to electrically or pneumatically control valves to control flow of precursors, reactants and purge gases into and out of reaction chamber 502. Controller 512 can include modules such as a software or hardware component, e.g., a FPGA or ASIC, which performs certain tasks. A module can advantageously be configured to reside on the addressable storage medium of the control system and be configured to execute one or more processes.

Other configurations of system 500 are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into reaction chamber 502. Further, as a schematic representation of a system, many components have been omitted for simplicity of illustration, and such components may include, for example, various valves, manifolds, purifiers, heaters, containers, vents, and/or bypasses.

During operation of reactor system 500, substrates 590, such as semiconductor wafers, are transferred from, e.g., a substrate handling system to reaction chamber 502. Once substrate(s) are transferred to reaction chamber 502, one or more gases from gas sources 504-508, such as precursors, reactants, carrier gases, and/or purge gases, are introduced into reaction chamber 502.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims. Although exemplary examples of the present disclosure are set forth herein, it should be appreciated that the disclosure is not so limited. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

What is claimed is:

1. A method comprising:

depositing a threshold voltage shifting layer comprising a metal sulfide on a substrate, wherein the depositing comprises:

a) providing a substrate having a surface within a reaction chamber;

b) providing an oxygen-free precursor comprising a metal to the reaction chamber to contact the surface;

c) providing an oxygen-free, sulfur-containing reactant compound to the reaction chamber to contact the surface;

d) purging the reaction chamber; and repeating operations b), c) or d) or any combination thereof until the threshold voltage shifting layer of a predetermined thickness is deposited on the surface, wherein the sulfur-containing reactant compound has a formula selected from:

(1) HS(CRR')xSH, wherein R and R' are independently selected from the group consisting of hydrogen (H), methyl (Me), ethyl (Et), n-propyl (nPr), and x is an integer from 1 to 12;

(2) S(SiRR’R")2, wherein R, R' and R" are independently selected from the group consisting of H, Me, Et, nPr, isopropyl (iPr), tert-butyl (tBu), normal butyl (nBu), sec-butyl (sec-Bu), and iso-butyl (iso-Bu); or (3) S2RR', wherein R and R' are independently selected from the group consisting of Me, Et, nPr, iPr, tBu, nBu, sec-Bu, and iso-Bu.

2. The method of claim 1, wherein the surface comprises an interlayer material and the threshold voltage shifting layer is deposited in a dipole first pattern directly onto the interlayer material surface.

3. The method of claim 1, wherein the surface comprises a high-k material and the threshold voltage shifting layer is deposited in a dipole last pattern directly onto the high-k material surface.

4. The method of claim 1, wherein the metal comprises titanium (Ti), zirconium (Zr), hafnium (Hf), tantalum (Ta), aluminum (Al), scandium (Sc), lutetium (Lu), yttrium (Y), magnesium (Mg), lanthanum (La), or strontium (Sr), or a combination thereof.

5. The method of claim 1, wherein the oxygen-free precursor is a metal cyclopentadienyl compound, and the metal comprises scandium (Sc), lutetium (Lu), yttrium (Y), magnesium (Mg), lanthanum (La), or strontium (Sr).

6. The method of claim 1, wherein the oxygen-free precursor is a metal alkylamido compound, and the metal comprises titanium (Ti), zirconium (Zr), hafnium (Hf), tantalum (Ta), or aluminum (Al).

7. The method of claim 1, wherein the oxygen-free precursor is a metal amidinate compound, and the metal comprises scandium (Sc), lutetium (Lu), yttrium (Y), magnesium (Mg), lanthanum (La), or strontium (Sr).

8. The method of claim 7, wherein the metal amidinate compound is of the formula (Formula 1):

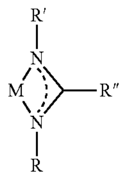

wherein: M is a metal; R and R' are independently any branched alkyl, unbranched alkyl, cyclic alkyl, or acyclic alkyl, or a combination thereof, containing from 1-10 carbon atoms; and R" is hydrogen, dimethylamino, diethylamino, ethylmethylamino or an alkyl containing 1-6 carbon atoms.

9. The method of claim 8, wherein R and R'are independently selected from the group consisting of isopropyl, tert-butyl, sec-butyl, and tert-pentyl.

10. The method of claim 8, wherein in R" is hydrogen or methyl.

11. The method of claim 1, wherein the sulfur-containing reactant compound is HS(CH2)2SH or HS(CH)3SH.

12. The method of claim 1, wherein the sulfur-containing reactant compound is S(SiMe3)2 or S(SiEt3)2.

13. The method of claim 1, wherein the sulfur-containing reactant compound is S2Me2, S2Et2 or S2(tBu)2.

* * * * *